(12) United States Patent
Kaprinidis

(10) Patent No.: US 7,678,852 B2
(45) Date of Patent: Mar. 16, 2010

(54) FLAME RETARDANT COMPOSITIONS

(75) Inventor: Nikolas Kaprinidis, New York, NY (US)

(73) Assignee: Ciba Corporation, Tarrytown, NY (US)

( * ) Notice: Subject to any disclaimer, the term of this patent is extended or adjusted under 35 U.S.C. 154(b) by 20 days.

(21) Appl. No.: 12/157,706

(22) Filed: Jun. 12, 2008

(65) Prior Publication Data

US 2009/0082494 A1 Mar. 26, 2009

Related U.S. Application Data

(60) Provisional application No. 60/934,598, filed on Jun. 14, 2007.

(51) Int. Cl.
*C08K 5/3492* (2006.01)
(52) U.S. Cl. ...................... 524/100; 524/123
(58) Field of Classification Search ................. 524/100, 524/123
See application file for complete search history.

(56) References Cited

U.S. PATENT DOCUMENTS

| | | | | |
|---|---|---|---|---|
| 5,166,283 A | * | 11/1992 | Nishikawa et al. | 526/241 |
| 5,739,217 A | * | 4/1998 | Hagiwara et al. | 525/476 |
| 7,449,526 B2 | * | 11/2008 | Levchik et al. | 525/523 |
| 2003/0207969 A1 | | 11/2003 | Capocci et al. | 524/236 |
| 2004/0025743 A1 | | 2/2004 | Wakizaka et al. | 106/18.11 |
| 2004/0198878 A1 | * | 10/2004 | Kakegawa et al. | 524/115 |
| 2005/0014875 A1 | | 1/2005 | Knop et al. | 524/126 |
| 2005/0049339 A1 | | 3/2005 | Knop et al. | 524/115 |
| 2008/0073629 A1 | * | 3/2008 | Chen | 252/609 |

FOREIGN PATENT DOCUMENTS

| | | |
|---|---|---|
| WO | 03/029258 | 4/2003 |
| WO | 2004/041919 | 5/2004 |
| WO | 2004/060957 | 7/2004 |

OTHER PUBLICATIONS

Wu et al., Journal of Applied Polymer Science, vol. 101, pp. 4011-4022 (2006).
M. Schmidt et al., Die Angewandte Makromolekulare Chemie, vol. 132, No. 2165, (1985), pp. 1-18.

* cited by examiner

*Primary Examiner*—Peter Szekely
(74) *Attorney, Agent, or Firm*—Tyler A. Stevenson

(57) ABSTRACT

Polymer compositions are afforded flame retardancy with the incorporation of a combination of melamine polyphosphate and poly(m-phenylene methylphosphonate). The polymer compositions are for instance epoxy resins for prepegs, laminates and printed circuit boards. The epoxy resins are for example for coating electronic parts. The polymer compositions are also thermoplastics such as polyolefins or polystyrenics, useful as fibers, films or molded parts. The melamine polyphosphate may be of a fine particle size.

19 Claims, No Drawings

FLAME RETARDANT COMPOSITIONS

This application claims benefit of U.S. provisional application No. 60/934,598, filed Jun. 14, 2007, the contents of which are incorporated by reference.

The present invention is aimed at flame retardant polymer compositions that comprise a combination of melamine polyphosphate and poly(m-phenylene methylphosphonate).

BACKGROUND

U.S. published app. No. 2004/0025743 is aimed at flame retardant insulating resins.

The article "Curing of Epoxy Resin with Poly(m-phenylene methylphosphonate), *Journal of Applied Polymer Science*, Vol. 101, 4011-4022 (2006) teaches curing of epoxy resin with poly(m-phenylene methylphosphonate).

U.S. published app. No. 2003/0207969 discloses flame retardant polymer compositions.

SUMMARY

The present invention is aimed at a flame retardant polymer composition which comprises
a polymer substrate and
incorporated therein an effective flame retarding amount of melamine polyphosphate and poly(m-phenylene methylphosphonate).

DETAILED DISCLOSURE

The melamine polyphosphate is for example in particulate form. The melamine polyphosphate may advantageously be a fine particle size, for example where about 99% of the particles have a diameter of less than or equal to about 15 microns.

For instance, the melamine polyphosphate is defined as having about 50% of the particles having a diameter of from about 3.0 to about 3.5 microns. For instance about 99% of the melamine polyphosphate particles have a diameter of less than or equal to about 12 microns.

Poly(m-phenylene methylphosphonate) has the following oligomeric structure:

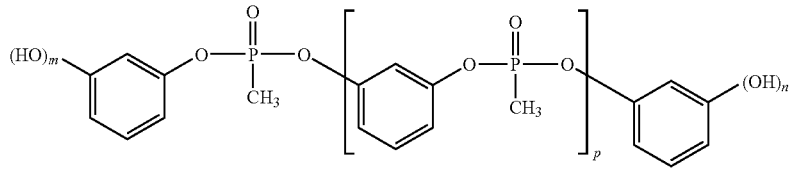

where m and n are 0 or 1 and
p is an integer such that the number average molecular weight is about 1400.

The flame retardant combination of melamine polyphosphate and poly(m-phenylene methylphosphonate) is present in the polymer compositions at a level from about 1% to about 40% by weight, based on the weight of the polymer. For instance the flame retardant composition is present from about 5% to about 40% by weight, from about 10% to about 40% by weight, from about 15% to about 40% by weight or from about 20% to about 40% by weight, based on the weight of the polymer.

The weight:weight ratio of melamine polyphosphate to poly(m-phenylene methylphosphonate) is from about 5:95 to about 95:5, from about 10:90 to about 90:10, from about 15:85 to about 85:15, from about 20:80 to about 80:20, from about 25:75 to about 75:25, from about 30:70 to about 70:30, from about 35:65 to about 65:35, from about 40:60 to about 60:40, from about 45:55 to about 55:45, or about 50:50 (1:1).

The polymer compositions may include other flame retardants, for instance non-halogenated flame retardants such as
melamine cyanurate,
melamine borate,
melamine phosphate or
melamine pyrophosphate.

The polymer compositions may include other conventional flame retardants, for instance organohalogen flame retardants or phosphorus containing flame retardants.

Organohalogen flame retardants are for instance:
Chloroalkyl phosphate esters (ANTI BLAZE® AB-100, Albright & Wilson; FYROL® FR-2, Akzo Nobel),
polybrominated diphenyl oxide (DE-60F, Great Lakes Corp.),
decabromodiphenyl oxide (DBDPO; SAYTEX® 102E),
tris[3-bromo-2,2-bis(bromomethyl)propyl]phosphate (PB 370®, FMC Corp.),
bis(2,3-dibromopropyl ether) of bisphenol A (PE68),
brominated epoxy resin,
ethylene-bis(tetrabromophthalimide) (SAYTEX® BT-93),
bis(hexachlorocyclopentadieno)cyclooctane (DECLORANE PLUS®),
chlorinated paraffins,
1,2-bis(tribromophenoxy)ethane (FF680),
tetrabromo-bisphenol A (SAYTEX® RB100),
ethylene bis-(dibromo-norbornanedicarboximide) (SAYTEX® BN-451),
bis-(hexachlorocyclopentadieno) cyclooctane,
tris-(2,3-dibromopropyl)-isocyanurate and
ethylene-bis-tetrabromophthalimide.

Additional phosphorus containing flame retardants are for example:
Tetraphenyl resorcinol diphosphite (FYROLFLEX® RDP, Akzo Nobel),
triphenyl phosphate,
ammonium polyphosphate (APP) or (HOSTAFLAM® AP750),
resorcinol diphosphate oligomer (RDP) and
ethylenediamine diphosphate (EDAP).

The polymer compositions may comprise hindered alkoxyamine stabilizers, as disclosed in published U.S. app. No. 2003/0207969, incorporated herein by reference.

For instance, the present compositions may also include one or more of the hindered alkoxyamine stabilizers 1-cyclohexyloxy-2,2,6,6-tetramethyl-4-octadecylaminopiperidine;
bis(1-octyloxy-2,2,6,6-tetramethylpiperidin-4-yl) sebacate;
2,4-bis[(1-cyclohexyloxy-2,2,6,6-tetramethylpiperidin-4-yl)butylamino]-6-(2-hydroxyethylamino-s-triazine;
bis(1-cyclohexyloxy-2,2,6,6-tetramethylpiperidin-4-yl) adipate;
2,4-bis[(1-cyclohexyloxy-2,2,6,6-piperidin-4-yl)butylamino]-6-chloro-s-triazine;
1-(2-hydroxy-2-methylpropoxy)-4-hydroxy-2,2,6,6-tetramethylpiperidine;
1-(2-hydroxy-2-methylpropoxy)-4-oxo-2,2,6,6-tetramethylpiperidine;
1-(2-hydroxy-2-methylpropoxy)-4-octadecanoyloxy-2,2,6,6-tetramethylpiperidine;
bis(1-(2-hydroxy-2-methylpropoxy)-2,2,6,6-tetramethylpiperidin-4-yl) sebacate;
bis(1-(2-hydroxy-2-methylpropoxy)-2,2,6,6-tetramethylpiperidin-4-yl) adipate;
2,4-bis{N-[1-(2-hydroxy-2-methylpropoxy)-2,2,6,6-tetramethylpiperidin-4-yl]-N-butylamino}-6-(2-hydroxyethylamino)-s-triazine;
the reaction product of 2,4-bis[(1-cyclohexyloxy-2,2,6,6-piperidin-4-yl)butylamino]-6-chloro-s-triazine with N,N'-bis(3-aminopropyl)ethylenediamine) [CAS Reg. No. 191680-81-6]; and
the compound of formula The polymer substrates are for example epoxy resins or thermoplastic resins.

Epoxy Resins

Epoxy resins are employed for example in prepegs, laminates and printed circuit boards. Epoxy resins are used for coating electronic parts.

U.S. published app. Nos. 2004/0166241 and 2004/0166325 teach electronic epoxy molding compositions comprising melamine cyanurate as a flame retardant. The disclosures of these references are incorporated by reference.

There is no restriction on the type of epoxy resin that can be used in the prepregs, laminates and circuit boards of this invention. It generally contains two or more reactive oxirane groups. For example, the epoxy resin may be selected from bisphenol A type epoxy resins, novolac type epoxy resins such as epoxy cresol novolac resin and phenolic novolac epoxy resin, alicyclic epoxy resins, glycidyl type epoxy resins, biphenyl epoxy resins, naphthalene ring-containing epoxy resins, cyclopentadiene containing epoxy resins, polyfunctional epoxy resins, hydroquinone epoxy resins, and stilbene epoxy resins. The prepregs and laminates can include more than one epoxy resin, for example, a combination of epoxy cresol novolac resin and biphenyl epoxy resin.

As noted, bisphenol and biphenyl epoxy resins, which are traditionally referenced as di-epoxies, and epoxy cresol novalac resins, which are traditionally referenced as multifunctional epoxies, are useful in the present invention. Such epoxies have a degree of branching of two, in that two phe-

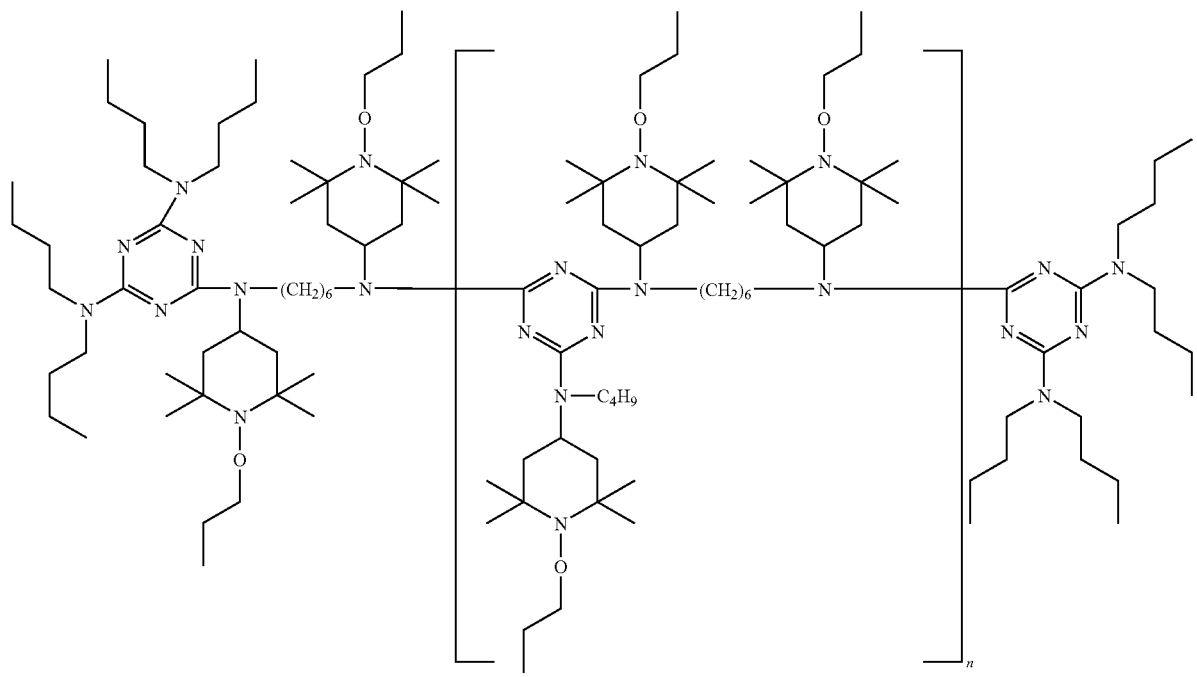

in which n is from 1 to 15.

The polymer compositions may also advantageously contain conventional stabilizers such as hindered amine light stabilizers, benzofuranone stabilizers, organophosphorus stabilizers, hydroxylamine stabilizers, phenolic antioxidants or benzophenone, benzotriazole or triazine ultraviolet light absorbers.

nolic groups having pendant epoxies are linked through the same carbon atom. For example, diglycidyl ether of bisphenol A is difunctional, including two phenolic groups with pendant epoxies extending from a central carbon atom. It therefore has a degree of branching of two. Epoxy cresol novolac resins are often times referenced as "multifunctional", in that they are polymeric compounds with a plurality of pendant epoxy moieties which may extend from the polymeric chain. For example, epoxy cresol novolac resins include the following structure:

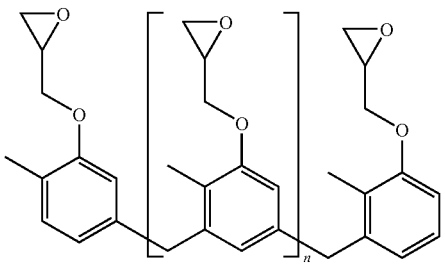

When n=0, the functionality if this structure would be 2. If n=1, the functionality, is 3, if n=4, the functionality is 4, etc. As such, this compound is traditionally referred to as a multifunctional epoxy resin. However, since only two phenolic groups extend from the same carbon or small cluster of carbons, the degree of branching of this type of resin would be equal to two.

In a particularly desirable embodiment, the epoxy resin is a multifunctional epoxy resin having a degree of branching within the resin backbone of at least three. Thus, particularly desirable multifunctional epoxy resins are those derived from phenol and which include at least three phenolic groups branching directly from the same central carbon atom or central cluster of carbons, with a pendant oxirane group linked to each of the at least three phenolic groups.

Non-limiting examples of useful multifunctional epoxy resins having a degree of branching of at least three include:

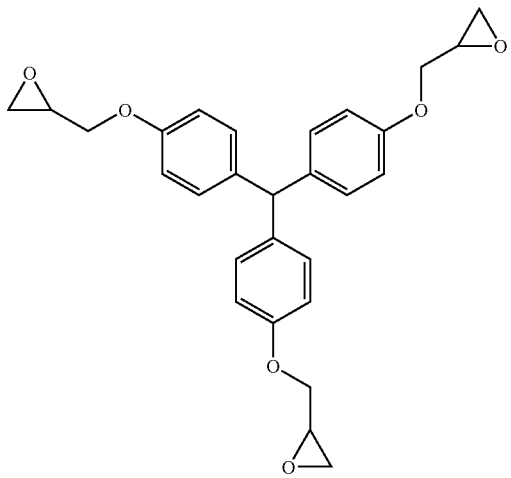

triphenylol methane triglycidyl ether (having a degree of branching of three, represented by three terminal glycidyl ether moieties branching from a central carbon atom);

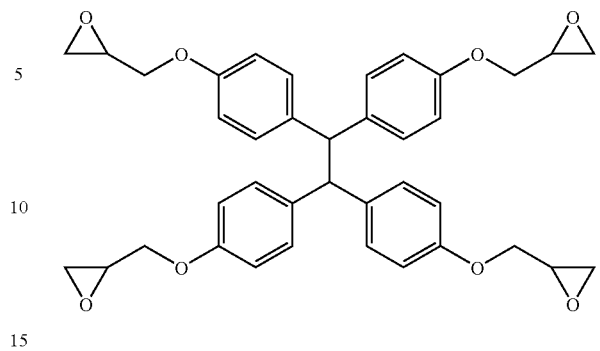

tetra glycidyl ether of tetra phenol ethane (having a degree of branching of four, represented by four terminal glycidyl ether moieties branching from a central two carbon cluster ethyl moiety).

Particularly desirable are epoxy resins derived from tris-phenolmethane, such as triphenylol methane triglycidyl ether.

The multifunctional resin having a degree of branching of at least three may be used alone, or in combination with conventional resins such as those described above.

The epoxy resin typically has a theoretical epoxy equivalent weight of about 150 to 250. The epoxy resin is for example present in the composition of the present invention in an amount of about 1 to 25 percent by weight, often 4 to about 12 percent by weight, and more often, from about 5.5 to about 8.5 percent by weight, based on the total weight of the composition.

The prepregs and laminates typically contain a curing agent (hardener). The curing agent promotes crosslinking of the resin to form a polymer composition upon heating of the composition to a temperature of at least about 135° C. Some suitable curing agents that can be included in the present invention are phenol novolac type hardener, cresol novolac type hardener, dicyclopentadiene phenol type hardener, limonene type hardener, and anhydrides. Flexible hardeners having a hydroxyl equivalent weight greater than about 150 are often desirable, such as xylock novalac type hardener. Non-limiting examples of flexible hardeners include bisphenol M commercially available from Borden Chemical, and DEH 85, commercially available from Dow Chemical. Similar to the epoxy resin component, more than one type of curing agent can be included in the present compositions.

As with the epoxy resin component, multifunctional hardeners having a degree of branching of at least three are particularly desirable in one embodiment of the present invention. Particularly desirable are those derived from tris-phenol and which contain at least three functional groups that are reactive with epoxide groups.

The curing agent is for example present in the composition of the present invention in an amount of about 1 percent by weight to about 10 percent by weight, often from about 1.5 percent by weight to about 6 percent by weight, based on the total weight of the composition.

The composition may further include a catalyst for promoting reaction of the epoxy resin and the hardener. Traditionally, such epoxy compositions incorporate catalysts such as tertiary amines, substituted phosphines, imidazoles, and the like, with compounds such as 1,8-diazabicyclo[5.4.0]undec-7-ene ("DBU"), dicyandiamide ("DICY") and triphenylphosphine ("TPP") being particularly well known for use as catalysts.

The catalyst is present at least in an amount sufficient to catalytically effect crosslinking of the epoxy resin and curing agent when the composition is heated to a temperature of at least about 135° C.

The epoxy resin conveniently comprises a filler. The filler may be for example polymeric microspheres or traditional glass microspheres as disclosed in U.S. Pat. No. 6,632,511, the contents of which are hereby incorporated by reference.

Other resins may be suitable for use in printed circuit board applications. For example, resins such as epoxy, phenolic resin, benzoxazine, polyimide, cyanate ester, bismaleimide triazine, polyester, polyphenylene ether resins, polystyrene, polyphenylene oxide, polyphenylene sulfide, polysulfone, polyethersulfone, polyetherimide, polyacetal, polycarbonate and the co-polymers and blends thereof.

In addition, the resin may additionally comprise a variety of additives, individually or in the various combinations and permutations thereof. For example, the resin may optionally comprise an ultraviolet light blocking dye, a pigment (such as $TiO_2$, $Fe_2O_3$) or resin to increase the opacity of the prepreg, laminate or printed circuit board to ultraviolet light. The resin may also optionally comprise a further flame retardant, for example, a halogen compound such as a brominated epoxy or brominated filler, or a halogen-free compound such as a phosphorus, nitrogen, or boron containing compound to increase the fire or flame-resistance. Preferably, no further flame retardants are employed. The resin may optionally comprise a surfactant such as Chemie BYK 322, an inorganic flow modifier such as hydrophobic fumed silica, and/or a thixotropy agent. Typically, these additive(s) will, in combination, comprise about 3 wt. % to about 20 wt. % of the resin. If the halogen substance is an epoxy resin, the bromine comprises about 15% to about 60% by weight of said resin, and about 5% to about 30% by weight of the total solid content. If the halogen substance is a filler, the bromine comprises about 20% to about 85% by weight of said filler, and about 5% to about 30% by weight of the total solid content.

Prepregs of the present invention are formed by impregnating a reinforcing material with a varnish comprising (i) solvent and (ii) a polymeric resin (typically partially cured) or resin monomer. The reinforcing material selected generally depends upon the desired properties for the finished laminate. These include thickness, dielectric constant (Dk), coefficient of thermal expansion ("CTE"), and the intended product application. In general, the reinforcing material may be a woven or non-woven mat comprising a fibrous material such as ceramic, glass, or polymeric fibers. Low dielectric constant materials such as electronics grade glass, D-glass, aramids such as Kevlar® and Nomex®, both registered trademarks of E. I. Dupont de Nemours and Company, poly p-phenylene benzobisthiazole, poly p-phenylene benzobisoxazole, polyetheretherketone, PTFE, aromatic polyesters, quartz, S-glass, paper, and the like, or combinations thereof may be used to form the mat of fibrous material. The reinforcing material may be in a cowoven or comingled form.

The laminates of the present invention are prepared from prepregs using conventional techniques such as flat bed press or autoclave lamination. For example, prepreg sheets are sandwiched between two sheets of copper and laminated under heat and pressure (e.g., about 188° C. and 200-600 psi (about 13.75-40 Bar). Copper lines providing electrical pathways can be etched on to the resulting laminate. These can be used as a single substrate or pressed with other sheets of laminate, copper, and prepreg to produce a multi-layer laminate or printed circuit board.

The resulting laminate preferably has a relatively low dielectric constant. That is, the laminate preferably has a dielectric constant of less than 4.2 at 50% resin content. In some embodiments, the dielectric constant is preferably less than 3.9 at 50% resin content, more preferably less than 3.5 at 50% resin content, and may be no greater than 3.0 at 50% resin content.

Prepregs, laminates and printed circuit boards incorporating the present flame retardants may be prepared in accordance with the present invention with existing equipment and methods. For example, a prepreg is most often produced on treaters. The main components of a treater include feeder rollers, a resin impregnation tank, a treater oven, and receiver rollers. The reinforcing fabric (E-glass, for example) is usually rolled into a large spool. The spool is then put on the feeder rollers which turn and slowly roll out the glass. The glass then moves through the resin impregnation tank, which contains the varnish. The varnish wets out the glass. After emerging from the tank, the coated glass moves upward through the vertical treater oven which is typically at a temperature of about 350 to 400° F. (about 175° C. to 200° C.), and the solvent of the varnish is boiled away. The resin begins to polymerize at this time. When the composite comes out of the tower it is sufficiently cured so that the web is not wet or tacky. The cure process, however, is stopped short of completion so that additional curing can occur when laminate is made. The web then rolls the prepreg onto the receiver rolls which can be changed when the run is finished. A new roll is then attached to the treater so that a new run can begin.

The laminates prepared in accordance with the present invention have good electrical properties such as a relatively low dielectric constant, good thermal properties such as higher decomposition temperature, good T-260 and T-288 properties, as well as good mechanical properties such as thermal expansion characteristics (CTE and Z axis expansion). The prepreg and laminate prepared by this method also have good machinability, low density, and processability with the existing equipment/methods of prepreg manufacture.

This invention can be used with both passive and active components of printed circuit boards. The resulting prepreg and laminate have good electrical, thermal, mechanical, and processable properties as well as homogeneity in drilling and other printed circuit board machining operations.

Thermoplastic Polymers

The thermoplastic polymer substrate is any of a wide variety of polymers including polyolefins, polystyrenics, epoxy resins and PVC. For example, the polymer substrate may be selected from the group of resins consisting of the polyolefins, the thermoplastic olefins, styrenic polymers and copolymers, ABS and polymers which contain hetero atoms, double bonds or aromatic rings. Specific embodiments are where the polymer substrate is polypropylene, polyethylene, thermoplastic olefin (TPO), ABS or high impact polystyrene.

For example, the polymer substrate is selected from the group of resins consisting of polyolefins, thermoplastic olefins, styrenic polymers and copolymers, and ABS.

Another embodiment of the present invention is where the polymer substrate is selected from the group consisting of polypropylene, polyethylene, thermoplastic olefin (TPO), ABS and high impact polystyrene.

For instance, the polymer substrate is polypropylene, polyethylene or thermoplastic olefin (TPO). Organic polymers are for example thermoplastic polymers such as polyolefins like polyethylene, polypropylene or copolymers thereof. The thermoplastic polymer is for example polypropylene.

Further examples for thermoplastic polymers are:

1. Polymers of monoolefins and diolefins, for example polypropylene, polyisobutylene, polybut-1-ene, poly-4-methylpent-1-ene, polyvinylcyclohexane, polyisoprene or polybutadiene, as well as polymers of cycloolefins, for instance of cyclopentene or norbornene, polyethylene (which optionally can be crosslinked), for example high density polyethylene (HDPE), high density and high molecular weight polyethylene (HDPE-HMW), high density and ultra-high molecular weight polyethylene (HDPE-UHMW), medium density polyethylene (MDPE), low density polyethylene (LDPE), linear low density polyethylene (LLDPE), (VLDPE) and (ULDPE).

Polyolefins, i.e. the polymers of monoolefins exemplified in the preceding paragraph, for example polyethylene and polypropylene, can be prepared by different, and especially by the following, methods:

a) radical polymerization (normally under high pressure and at elevated temperature).

b) catalytic polymerization using a catalyst that normally contains one or more than one metal of groups IVb, Vb, VIb or VIII of the Periodic Table. These metals usually have one or more than one ligand, typically oxides, halides, alcoholates, esters, ethers, amines, alkyls, alkenyls and/or aryls that may be either π- or σ-coordinated. These metal complexes may be in the free form or fixed on substrates, typically on activated magnesium chloride, titanium(III) chloride, alumina or silicon oxide. These catalysts may be soluble or insoluble in the polymerization medium. The catalysts can be used by themselves in the polymerization or further activators may be used, typically metal alkyls, metal hydrides, metal alkyl halides, metal alkyl oxides or metal alkyloxanes, said metals being elements of groups Ia, IIa and/or IIIa of the Periodic Table. The activators may be modified conveniently with further ester, ether, amine or silyl ether groups. These catalyst systems are usually termed Phillips, Standard Oil Indiana, Ziegler (-Natta), TNZ (DuPont), metallocene or single site catalysts (SSC).

2. Mixtures of the polymers mentioned under 1), for example mixtures of polypropylene with polyisobutylene, polypropylene with polyethylene (for example PP/HDPE, PP/LDPE) and mixtures of different types of polyethylene (for example LDPE/HDPE).

3. Copolymers of monoolefins and diolefins with each other or with other vinyl monomers, for example ethylene/propylene copolymers, linear low density polyethylene (LLDPE) and mixtures thereof with low density polyethylene (LDPE), propylene/but-1-ene copolymers, propylene/isobutylene copolymers, ethylene/but-1-ene copolymers, ethylene/hexene copolymers, ethylene/methylpentene copolymers, ethylene/heptene copolymers, ethylene/octene copolymers, ethylene/vinylcyclohexane copolymers, ethylene/cycloolefin copolymers (e.g. ethylene/norbornene like COC), ethylene/1-olefins copolymers, where the 1-olefin is generated in-situ; propylene/butadiene copolymers, isobutylene/isoprene copolymers, ethylene/vinylcyclohexene copolymers, ethylene/alkyl acrylate copolymers, ethylene/alkyl methacrylate copolymers, ethylene/vinyl acetate copolymers or ethylene/acrylic acid copolymers and their salts (ionomers) as well as terpolymers of ethylene with propylene and a diene such as hexadiene, dicyclopentadiene or ethylidene-norbornene; and mixtures of such copolymers with one another and with polymers mentioned in 1) above, for example polypropylene/ethylene-propylene copolymers, LDPE/ethylene-vinyl acetate copolymers (EVA), LDPE/ethylene-acrylic acid copolymers (EAA), LLDPE/EVA, LLDPE/EAA and alternating or random polyalkylene/carbon monoxide copolymers and mixtures thereof with other polymers, for example polyamides.

4. Hydrocarbon resins (for example $C_5$-$C_9$) including hydrogenated modifications thereof (e.g. tackifiers) and mixtures of polyalkylenes and starch.

Homopolymers and copolymers from 1.)-4.) may have any stereostructure including syndiotactic, isotactic, hemi-isotactic or atactic; for example atactic polymers. Stereoblock polymers are also included.

5. Polystyrene, poly(p-methylstyrene), poly(α-methylstyrene).

6. Aromatic homopolymers and copolymers derived from vinyl aromatic monomers including styrene, α-methylstyrene, all isomers of vinyl toluene, especially p-vinyltoluene, all isomers of ethyl styrene, propyl styrene, vinyl biphenyl, vinyl naphthalene, and vinyl anthracene, and mixtures thereof. Homopolymers and copolymers may have any stereostructure including syndiotactic, isotactic, hemi-isotactic or atactic; for example atactic polymers. Stereoblock polymers are also included.

6a. Copolymers including aforementioned vinyl aromatic monomers and comonomers selected from ethylene, propylene, dienes, nitriles, acids, maleic anhydrides, maleimides, vinyl acetate and vinyl chloride or acrylic derivatives and mixtures thereof, for example styrene/butadiene, styrene/acrylonitrile, styrene/ethylene (interpolymers), styrene/alkyl methacrylate, styrene/butadiene/alkyl acrylate, styrene/butadiene/alkyl methacrylate, styrene/maleic anhydride, styrene/acrylonitrile/methyl acrylate; mixtures of high impact strength of styrene copolymers and another polymer, for example a polyacrylate, a diene polymer or an ethylene/propylene/diene terpolymer; and block copolymers of styrene such as styrene/butadiene/styrene, styrene/isoprene/styrene, styrene/ethylene/butylene/styrene or styrene/ethylene/propylene/styrene.

6b. Hydrogenated aromatic polymers derived from hydrogenation of polymers mentioned under 6.), especially including polycyclohexylethylene (PCHE) prepared by hydrogenating atactic polystyrene, often referred to as polyvinylcyclohexane (PVCH).

6c. Hydrogenated aromatic polymers derived from hydrogenation of polymers mentioned under 6a.).

Homopolymers and copolymers may have any stereostructure including syndiotactic, isotactic, hemi-isotactic or atactic; for example atactic polymers. Stereoblock polymers are also included.

7. Graft copolymers of vinyl aromatic monomers such as styrene or α-methylstyrene, for example styrene on polybutadiene, styrene on polybutadiene-styrene or polybutadiene-acrylonitrile copolymers; styrene and acrylonitrile (or methacrylonitrile) on polybutadiene; styrene, acrylonitrile and methyl methacrylate on polybutadiene; styrene and maleic anhydride on polybutadiene; styrene, acrylonitrile and maleic anhydride or maleimide on polybutadiene; styrene and maleimide on polybutadiene; styrene and alkyl acrylates or methacrylates on polybutadiene; styrene and acrylonitrile on ethylene/propylene/diene terpolymers; styrene and acrylonitrile on polyalkyl acrylates or polyalkyl methacrylates, styrene and acrylonitrile on acrylate/butadiene copolymers, as well as mixtures thereof with the copolymers listed under 6), for example the copolymer mixtures known as ABS, MBS, ASA or AES polymers.

8. Halogen-containing polymers such as polychloroprene, chlorinated rubbers, chlorinated and brominated copolymer of isobutylene-isoprene (halobutyl rubber), chlorinated or sulfochlorinated polyethylene, copolymers of ethylene and chlorinated ethylene, epichlorohydrin homo- and copolymers, especially polymers of halogen-containing vinyl compounds, for example polyvinyl chloride, polyvinylidene chloride, polyvinyl fluoride, polyvinylidene fluoride, as well as copolymers thereof such as vinyl chloride/vinylidene chloride, vinyl chloride/vinyl acetate or vinylidene chloride/vinyl acetate copolymers.

9. Polymers derived from α,β-unsaturated acids and derivatives thereof such as polyacrylates and polymethacrylates; polymethyl methacrylates, polyacrylamides and polyacrylonitriles, impact-modified with butyl acrylate.

10. Copolymers of the monomers mentioned under 9) with each other or with other unsaturated monomers, for example acrylonitrile/butadiene copolymers, acrylonitrile/alkyl acrylate copolymers, acrylonitrile/alkoxyalkyl acrylate or acrylonitrile/vinyl halide copolymers or acrylonitrile/alkyl methacrylate/butadiene terpolymers.

11. Polymers derived from unsaturated alcohols and amines or the acyl derivatives or acetals thereof, for example polyvinyl alcohol, polyvinyl acetate, polyvinyl stearate, polyvinyl benzoate, polyvinyl maleate, polyvinyl butyral, polyallyl phthalate or polyallyl melamine; as well as their copolymers with olefins mentioned in 1) above.

12. Homopolymers and copolymers of cyclic ethers such as polyalkylene glycols, polyethylene oxide, polypropylene oxide or copolymers thereof with bisglycidyl ethers.

13. Polyacetals such as polyoxymethylene and those polyoxymethylenes which contain ethylene oxide as a comonomer; polyacetals modified with thermoplastic polyurethanes, acrylates or MBS.

14. Polyphenylene oxides and sulfides, and mixtures of polyphenylene oxides with styrene polymers or polyamides.

15. Polyurethanes derived from hydroxyl-terminated polyethers, polyesters or polybutadienes on the one hand and aliphatic or aromatic polyisocyanates on the other, as well as precursors thereof.

16. Polyamides and copolyamides derived from diamines and dicarboxylic acids and/or from aminocarboxylic acids or the corresponding lactams, for example polyamide 4, polyamide 6, polyamide 6/6, 6/10, 6/9, 6/12, 4/6, 12/12, polyamide 11, polyamide 12, aromatic polyamides starting from m-xylene diamine and adipic acid; polyamides prepared from hexamethylenediamine and isophthalic or/and terephthalic acid and with or without an elastomer as modifier, for example poly-2,4,4,-trimethylhexamethylene terephthalamide or poly-m-phenylene isophthalamide; and also block copolymers of the aforementioned polyamides with polyolefins, olefin copolymers, ionomers or chemically bonded or grafted elastomers; or with polyethers, e.g. with polyethylene glycol, polypropylene glycol or polytetramethylene glycol; as well as polyamides or copolyamides modified with EPDM or ABS; and polyamides condensed during processing (RIM polyamide systems).

17. Polyureas, polyimides, polyamide-imides, polyetherimides, polyesterimides, polyhydantoins and polybenzimidazoles.

18. Polyesters derived from dicarboxylic acids and diols and/or from hydroxycarboxylic acids or the corresponding lactones, for example polyethylene terephthalate, polybutylene terephthalate, poly-1,4-dimethylolcyclohexane terephthalate, polyalkylene naphthalate (PAN) and polyhydroxybenzoates, as well as block copolyether esters derived from hydroxyl-terminated polyethers; and also polyesters modified with polycarbonates or MBS.

19. Polycarbonates and polyester carbonates.

20. Polyketones.

21. Polysulfones, polyether sulfones and polyether ketones.

22. Blends of the aforementioned polymers (polyblends), for example PP/EPDM, Polyamide/EPDM or ABS, PVC/EVA, PVC/ABS, PVC/MBS, PC/ABS, PBTP/ABS, PC/ASA, PC/PBT, PVC/CPE, PVC/acrylates, POM/thermoplastic PUR, PC/thermoplastic PUR, POM/acrylate, POM/MBS, PPO/HIPS, PPO/PA 6.6 and copolymers, PA/HDPE, PA/PP, PA/PPO, PBT/PC/ABS or PBT/PET/PC.

Regarding polyolefins, polystyrene and other thermoplastic polymers, the flame retardant additives of the invention and optional further components may be added to the polymer material individually or mixed with one another. If desired, the individual components can be mixed with one another before incorporation into the polymer for example by dry blending, compaction or in the melt. Subject of the invention therefore is also a flame retardant additive combination comprising melamine polyphosphate and poly(m-phenylene methylphosphonate).

Conveniently, the flame retardant additives and possibly further additives may be dry blended and then extruded, for instance in a twin screw extruder at 180-220° C., with or without nitrogen atmosphere. The material thus obtained may be further processed according to known methods. The surface of the articles formed do not show any loss of gloss or any kind of roughness.

Further, the instant invention pertains to a process for imparting flame retardancy to an organic polymer substrate, which process comprises incorporating into said polymer substrate an effective flame retarding amount of a mixture of melamine polyphosphate and poly(m-phenylene methylphosphonate).

The incorporation of the additives of the invention and optional further components into the polymer is carried out by known methods such as dry blending in the form of a powder, or wet mixing in the form of solutions, dispersions or suspensions for example in an inert solvent, water or oil. The additives of the invention and optional further additives may be incorporated, for example, before or after molding or also by applying the dissolved or dispersed additive or additive mixture to the polymer material, with or without subsequent evaporation of the solvent or the suspension/dispersion agent. They may be added directly into the processing apparatus (e.g. extruders, internal mixers, etc), e.g. as a dry mixture or powder or as solution or dispersion or suspension or melt.

The incorporation can be carried out in any heatable container equipped with a stirrer, e.g. in a closed apparatus such as a kneader, mixer or stirred vessel. The incorporation is for example carried out in an extruder or in a kneader. It is immaterial whether processing takes place in an inert atmosphere or in the presence of oxygen.

The addition of the additives or additive blend to the polymer can be carried out in all customary mixing machines in which the polymer is melted and mixed with the additives. Suitable machines are known to those skilled in the art. They are predominantly mixers, kneaders and extruders.

The process is for instance carried out in an extruder by introducing the additive during processing.

Specific examples of suitable processing machines are single-screw extruders, contrarotating and corotating twin-screw extruders, planetary-gear extruders, ring extruders or cokneaders. It is also possible to use processing machines provided with at least one gas removal compartment to which a vacuum can be applied.

Suitable extruders and kneaders are described, for example, in *Handbuch der Kunststoffextrusion, Vol. 1 Grundlagen,* Editors F Hensen, W. Knappe, H. Potente, 1989, pp. 3-7, ISBN:3-446-14339-4 (*Vol. 2 Extrusionsanlagen* 1986, ISBN 3-446-14329-7).

For example, the screw length is 1-60 screw diameters, for example 35-48 screw diameters. The rotational speed of the screw is for instance 10-600 rotations per minute (rpm), for example 25-300 rpm.

The maximum throughput is dependent on the screw diameter, the rotational speed and the driving force. The process of the present invention can also be carried out at a level lower than maximum throughput by varying the parameters mentioned or employing weighing machines delivering dosage amounts.

If a plurality of components are added, these can be premixed or added individually.

The additives of the invention and optional further additives can also be sprayed onto the polymer material. They are able to dilute other additives or their melts so that they can be sprayed also together with these additives onto the material. Addition by spraying during the deactivation of the polymerization catalysts is particularly advantageous; in this case, the steam evolved may be used for deactivation of the catalyst. In the case of spherically polymerized polyolefins it may, for example, be advantageous to apply the additives of the invention, optionally together with other additives, by spraying.

The additives of the invention and optional further additives can also be added to the polymer in the form of a masterbatch ("concentrate") which contains the components in a concentration of, for example, about 1% to about 40%, for example about 2% to about 20% by weight incorporated in a polymer. The polymer must not be necessarily of identical structure than the polymer where the additives are added finally. In such operations, the polymer can be used in the form of powder, granules, solutions, suspensions or in the form of lattices.

Incorporation can take place prior to or during the shaping operation. The materials containing the additives of the invention described herein are for example used for the production of molded articles, for example rotomolded articles, injection molded articles, profiles and the like.

Polyolefin molded articles of this invention may be used for example as roofing membranes, siding, window profiles and moldings. Such molded articles are for example about 5 mil to about 100 mil thick, for example about 20 mil to about 100 mil thick, for instance about 10 mil to about 80 mil, for example about 40 mil to about 100 mil thick. The polyolefin is in particular thermoplastic polyolefin (TPO). The molded articles of this invention exhibit better physical properties than the state of the art formulations, as exhibited by mechanical properties such as tensile strength, elongation resistance and crack resistance.

The thermoplastic compositions of the invention are useful for fibers, films or molded parts.

The compositions of the present invention are useful for many applications, for example outdoor applications, including the following:

Thermoplastic olefins

Paintable thermoplastic olefins

Polypropylene molded articles

Polyethylene film

Molded polypropylene with brominated flame retardants

Molded thermoplastic olefin with brominated flame retardants

Polyethylene film with brominated flame retardants

Thermoplastic elastomers with other costabilizers

Grease-filled wire and cable insulation

Coatings over plastic substrates

Polyolefin tanks or containers containing chemicals

Polyolefin films with an antifog agent

Polyolefin films with IR thermal fillers such as hydrotalcites, e.g. DHT4A

Polyolefin films with an antistatic agent

Flame-resistant molded polypropylene articles

Flame-resistant molded thermoplastic olefins

Flame-resistant polyethylene film

Pre-formed films for lamination to plastic substrates

Electronic appliances

Containers, boxes, bins for storage and transportation

Automotive applications e.g. dashboard, back board

Furniture e.g. stadium seats, public seats

Roofing sheets

Roofing membranes

Flooring materials

Liners

Profiles, for example window and door profiles

Geomembranes

Awning fabrics

Banner films

Upholstery

Drapery

Carpeting

Tents, tarpaulins

Surgical gowns, caps and other hospital applications

Fabrics

Ropes

Nets

Tire cords

Parachutes

The effective flame retarding amount of melamine polyphosphate and poly(m-phenylene methylphosphonate) is that needed to show flame retarding efficacy as measured by one of the standard methods used to assess flame retardancy. These include the NFPA 701 Standard Methods of Fire Tests for Flame-Resistant Textiles and Films, 1989 and 1996 editions; the UL 94 Test for Flammability of Plastic Materials for Parts in Devices and Appliances, 5th Edition, Oct. 29, 1996; Limiting Oxygen Index (LOI), ASTM D-2863; and Cone Calorimetry, ASTM E-1354. Ratings according to the UL 94 V test are as compiled in the following table:

| Rating | Afterflame time | Burning drips | Burn to Clamp |
|---|---|---|---|
| V-0 | <10 s | no | no |
| V-1 | <30 s | no | no |
| V-2 | <30 s | yes | no |
| Fail | <30 s |  | yes |
| Fail | >30 s |  | no |

The following Examples further illustrate the invention.

Test Methods

NFPA 701 Standard Methods of Fire Tests for Flame-Resistant Textiles and Films, 1989 and 1996 editions;

UL 94 Test for Flammability of Plastic Materials for Parts in Devices and Appliances, 5th Edition, Oct. 29, 1996;

Limiting Oxygen Index (LOI), ASTM D-2863;

Cone Calorimetry, ASTM E-1 or ASTM E 1354;

ASTM D 2633-82, burn test.

EXAMPLE 1

Molding grade polypropylene is dry blended with 10 weight percent of each of melamine polyphosphate and poly(m-phenylene methylphosphonate) and then melt compounded in a twin screw extruder at 220° C. Base stabilization is 500 ppm N,N-di(tallow)hydroxylamine and 500 ppm calcium stearate. Plaques (125 mil) are prepared by injection molding from the formulations using a Boy Injection Molder at 475° F. (246° C.). The specimens are tested for flame retardancy according to the UL-94 vertical burn test specifications.

The plaques exhibit excellent flame retardancy.

EXAMPLE 2

Polyethylene fibers are prepared from fiber grade polyethylene by dry blending with 10 wt percent of each of melamine polyphosphate and poly(m-phenylene methylphosphonate) and melt compounding at 400° F. Fibers are extruded from this formulation using a Hills laboratory scale fiber extruder. Socks are knitted from the fibers and are tested for flame retardancy according to NFPA 701 vertical burn method.

The fibers containing the present flame retardants exhibit excellent flame retardancy.

EXAMPLE 3

Fiber grade polypropylene is dry blended with test additives and then melt compounded at 234° C. (450° F.) into pellets. The pelletized fully formulated resin is then spun at 246° C. (475° F.) into fiber using a Hills laboratory model fiber extruder. The spun tow of 41 filaments is stretched at a ratio of 1:3.2 to give a final denier of 615/41.

Socks are knitted from the stabilized polypropylene fiber on a Lawson-Hemphill Analysis Knitter and tested under NFPA 701 vertical burn procedure. The time in seconds for the knitted sock to extinguish after the insult flame is removed is reported as "After Flame". Both the maximum time for any one replicate and the total time for ten replicates are measured. Efficacy as a flame retardant is demonstrated when low After Flame times are observed relative to a blank sample containing no flame retardant.

The specimens containing 10 wt percent of each of melamine polyphosphate and poly(m-phenylene methylphosphonate) exhibit excellent flame retardancy.

EXAMPLE 4

Film grade polyethylene is dry blended with test additives and then melt compounded into pellets. The pelletized fully formulated resin is then blown at 205° C. using a MPM Superior Blown film extruder.

The films are tested for flame retardancy under NFPA 701 test conditions. The specimens containing 10 wt percent of each of melamine polyphosphate and poly(m-phenylene methylphosphonate) exhibit excellent flame retardancy.

Film grade polypropylene is handled in a similar fashion and polypropylene films containing the present additive combinations also show excellent flame retardancy.

EXAMPLE 5

A varnish contains 190 g of epoxy cresol novalac resin, which is mixed with 0.5 g 2-methylimidazole in 3.6 g methyl ethyl ketone, and 7.2 g 1-methoxy-2-propanol. Also added are 12 weight % of fine particle size melamine polyphosphate and 12 weight % of poly(m-phenylene methylphosphonate). The mixture is then well stirred for 4 hours, and applied to 7628 style E-glass fabric. The glass fabric is then brought to the partially cured B-stage by heating at 171° C. for two and a half minutes. A four ply laminate is made, with size 1 oz. STD copper on one side and 1 oz. DST copper on another side, by pressing the prepreg and copper in a book at 188° C. and 140 psi for 90 minutes.

The prepregs and laminates exhibit excellent flame retardancy according to the UL 94 test.

EXAMPLE 6

Fine particle size melamine polyphosphate and poly(m-phenylene methylphosphonate) are mixed with a bisphenol A type epoxy resin (medium Tg 150° C.). Phenolic novolac and 2-methylimidazole are used as the hardener and catalyst, respectively. In a typical formulation, 100 g of resin are mixed with 80-85 g of the curing agent and 0.2-2.0 g of the catalyst. The combination of flame retardants comprises about 20 to 40 wt % based on solids. 80 g of methyl ethyl ketone are also added. The components are mixed for about 20 minutes and the gel time at 170° C. is determined. Impregnation of a glass cloth (type 7628) and oven curing at 170° C. is performed. The resultant "prepreg" is cut into equal size pieces and the layers (about nine) are piled up to be cured at 370° F. for 2 hours under 100 psi pressure. Strips are cut and tested for flame retardant efficacy according to UL 94 protocol.

Samples with 20 wt % poly(m-phenylene methylphosphonate) exhibit an after flame time of 35 seconds.

Samples with 30 wt % poly(m-phenylene methylphosphonate) exhibit an after flame time of 20 seconds.

Samples with 20 wt % poly(m-phenylene methylphosphonate) and 20 wt % melamine polyphosphate exhibit an after flame time of 5 seconds (achieving V0).

What is claimed is:

1. A flame retardant polymer composition which comprises
a polymer substrate and
incorporated therein an effective flame retarding amount of melamine polyphosphate and poly(m-phenylene methylphosphonate),
where the melamine polyphosphate and poly(m-phenylene methylphosphonate) flame retardants are present in a weight:weight ratio of from about 20:80 to about 80:20.

2. A composition according to claim 1 where the polymer substrate is an epoxy resin.

3. A composition according to claim 2 where the substrate is a prepreg or laminate for a printed circuit board.

4. A composition according to claim 2 where the melamine polyphosphate is in a particle form where about 99% of the particles have a diameter of less than or equal to about 15 microns.

5. A composition according to claim 2 which achieves a V-1 rating according to the UL 94 V test.

6. A composition according to claim 2 which achieves a V-0 rating according to the UL 94 V test.

7. A composition according to claim 2 where the epoxy resin is selected from the group consisting of bisphenol A epoxy resins, novolac epoxy resins, alicyclic epoxy resins, glycidyl epoxy resins, biphenyl epoxy resins, naphthalene ring containing epoxy resins, cyclopentadiene containing epoxy resins, polyfunctional epoxy resins and combinations thereof.

8. A composition according to claim 2 further comprising a curing agent selected from the group consisting of phenol novolac hardeners, cresol novolac hardeners, dicyclopentadiene phenol hardeners, limonene hardeners, flexible hardeners, anhydrides and combinations thereof.

9. A composition according to claim 2 where the melamine polyphosphate and poly(m-phenylene methylphosphonate) flame retardants, in total are present from about 1% to about 40% by weight, based on the weight of the resin.

10. A composition according to claim 1 where the polymer substrate is selected from the group consisting of polyolefins, thermoplastic olefins, styrenic polymers or copolymers, ABS and polymers which contain hetero atoms, double bonds or aromatic rings.

11. A composition according to claim 10 where the polymer substrate is polyethylene, polypropylene or copolymers thereof.

12. A composition according to claim 10 which achieves a V-1 rating according to the UL 94 V test.

13. A composition according to claim 10 which achieves a V-0 rating according to the UL 94 V test.

14. A composition according to claim 10 where the melamine polyphosphate and poly(m-phenylene methylphosphonate) flame retardants are present from about 1% to about 40% by weight, based on the weight of the substrate.

15. A composition according to claim 10 where the melamine polyphosphate and poly(m-phenylene methylphosphonate) flame retardants are present in a weight:weight ratio of from about 20:80 to about 80:20.

16. A composition according to claim 10 further comprising an organohalogen flame retardant or a further phosphorus containing flame retardant.

17. A composition according to claim 10 further comprising melamine cyanurate, melamine borate, melamine phosphate or melamine pyrophosphate.

18. A composition according to claim 10 further comprising a hindered alkoxyamine stabilizer.

19. A composition according to claim 10 further comprising one or more compounds selected from the group consisting of hindered amine light stabilizers, benzofuranone stabilizers, organophosphorus stabilizers, hydroxylamine stabilizers, phenolic antioxidants and benzophenone, benzotriazole or triazine ultraviolet light absorbers.

* * * * *